(12) United States Patent
Huang

(10) Patent No.: US 11,205,635 B2
(45) Date of Patent: Dec. 21, 2021

(54) LOW TEMPERATURE HYBRID BONDING STRUCTURES AND MANUFACTURING METHOD THEREOF

(71) Applicant: Shun-Ping Huang, Zhubei (TW)

(72) Inventor: Shun-Ping Huang, Zhubei (TW)

( * ) Notice: Subject to any disclaimer, the term of this patent is extended or adjusted under 35 U.S.C. 154(b) by 5 days.

(21) Appl. No.: 16/931,649

(22) Filed: Jul. 17, 2020

(65) Prior Publication Data

US 2021/0242166 A1 Aug. 5, 2021

Related U.S. Application Data

(60) Provisional application No. 62/970,189, filed on Feb. 5, 2020.

(51) Int. Cl.
*H01L 23/00* (2006.01)

(52) U.S. Cl.
CPC .............. *H01L 24/92* (2013.01); *H01L 24/11* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 2224/11845* (2013.01); *H01L 2224/11848* (2013.01); *H01L 2224/13022* (2013.01); *H01L 2224/13147* (2013.01); *H01L 2224/13553* (2013.01); *H01L 2224/13647* (2013.01); *H01L 2224/16147* (2013.01); *H01L 2224/32145* (2013.01); *H01L 2224/73203* (2013.01);
(Continued)

(58) Field of Classification Search
CPC ...................... H01L 24/92; H01L 24/11; H01L 2224/13147; H01L 2224/11848
See application file for complete search history.

(56) References Cited

U.S. PATENT DOCUMENTS 8,814,030 B2 * 8/2014 Yoon ....................... H01L 24/83
228/234.1
10,183,358 B2 * 1/2019 Remsburg .......... B23K 20/2333
(Continued)

FOREIGN PATENT DOCUMENTS

WO 2019060304 A1 3/2019
WO 2019199445 A1 10/2019

*Primary Examiner* — Dale E Page
*Assistant Examiner* — Wilner Jean Baptiste
(74) *Attorney, Agent, or Firm* — Rosenberg, Klein & Lee

(57) ABSTRACT

Devices and techniques including process steps make use of recesses in conductive interconnect structures to form reliable low temperature metallic bonds. A fill layer is deposited into the recesses prior to bonding. The fill layer is composed of noble metal (such as copper) and active metal (such as Zn). Then the fill metal layer is turned into a metal alloy after annealing. A dealloying is performed to the metal alloy to remove the active metal from the metal alloy while the noble metal remains to self-assemble into porous (nanoporous) structure metal. First conductive interconnect structures are bonded at ambient temperatures to second metallic interconnect structures using dielectric-to-dielectric direct bonding techniques, with the fill nanoporous metal layer in the recesses in one of the first and second interconnect structures. After the following batch annealing, the fill nanoporous metal layer turns into pure bulk metal same as conductive interconnect structures due to the heat expansion of conductive interconnect structures and nanoporous metal densification.

15 Claims, 6 Drawing Sheets

(52) U.S. Cl.
CPC ......... *H01L 2224/81011* (2013.01); *H01L 2224/8183* (2013.01); *H01L 2224/8184* (2013.01); *H01L 2224/81203* (2013.01); *H01L 2224/83203* (2013.01); *H01L 2224/9221* (2013.01)

(56) References Cited

U.S. PATENT DOCUMENTS

2017/0025381 A1    1/2017  Tsai et al.
2019/0319007 A1*  10/2019  Uzoh ................ H01L 24/09

* cited by examiner

LOW TEMPERATURE HYBRID BONDING STRUCTURES AND MANUFACTURING METHOD THEREOF

RELATED APPLICATION

This application claims the priority benefit of U.S. Provisional Application Ser. No. 62/970,189, filed on Feb. 5, 2020, the full disclosure of which is incorporated herein by reference.

BACKGROUND

1. Technical Field

The present disclosure relates to a low temperature hybrid bonding structures and method of improving the current 2.5D/3D heterogeneous integrated systems in better electrical performance and reliability than current direct hybrid bonding process. Moreover, a low temperature hybrid bonding structures and method can provide more cost-effective, higher manufacturing yield, and much environmental-friendly than current hybrid bonding solution.

2. Description of the Related Art

Emerging 2.5D/3D heterogeneous integrated circuit packaging for mobile SoC and high-performance computing (HPC) applications are primarily limited by the ultra-short and fine-pitch interconnections. Unfortunately, current copper-solder interconnect technology (shown in FIG. 1), such as flip-chip bonding and copper pillar bonding, faces the challenges of solder-bridging between bumps in fine-pitch, and the electromigration issues (such as crack and voids) of process control in few solder volume during reflow process. Moreover, the trapping or residue of pre-applied underfill at the bonding interface is also a serious concern.

The I/O density, bandwidth, and speed requirements for emerging mobile SoC and high-performance computing (HPC) applications drive the off-chip interconnect pitch to less than 40 μm and high electrical current-handling capability. Thus, the material and formation method of interconnects are needed to change to meet the above challenges.

All copper interconnections are the holy grail of semiconductor heterogeneous integration for decades. Cu—Cu direct bonding without solders has been identified as the ultimate goal for high-performance computing applications. However, Cu has its intrinsic material characteristics, such as: 1) high melting point of 1081° C.; 2) room-temperature oxidation; and 3) high elastic modulus (120-130 GPa) with less tolerance to non-coplanarities and inner stress. Direct bonding between copper electrodes requires high bonding force, assembly in ultra-vacuum, inert or reducing environments with temperatures far greater than that used for solder reflow (>300° C.), seamless bonded interface by expensive and complicated chemical-mechanical polishing (CMP) steps, and long annealing/bonding process period. In Cu—Cu direct bonding, the dielectric region around copper electrodes was recessed to remove copper oxidation and to improve copper electrode surface flatness after chemical-mechanical polishing (CMP) steps. The narrow gap/cavity between the dielectric layers in the bonded structure is difficult to underfill. Therefore, typical Cu—Cu direct bonding is high cost, low yield and state-of-art process.

Low temperature Cu/dielectric hybrid bonding is the most promising technology for 2.5D/3D heterogeneous integration applications to improve the electrical performance, vertical interconnects density and length, and reliability. Low temperature Cu/dielectric hybrid bonding is a Cu—Cu direct bonding combined with $SiO_2$—$SiO_2$ (oxide) or polymer adhesive dielectric bonding simultaneously with a seamless bonded interface. Because of the low process temperature and thermal expansion coefficient (CTE) mismatch between Cu and other materials, low temperature Cu/dielectric hybrid bonding is much challenging. Mainly, it can be divided into two main categories: 1) Cu/$SiO_2$ hybrid bonding; 2) Cu/Adhesive hybrid bonding by using different dielectric materials (such as BCB/PBO/PI polymer adhesive).

First, Cu/$SiO_2$ hybrid bonding is a Cu—Cu direct bonding combined with $SiO_2$—$SiO_2$ (oxide) bonding simultaneously with a seamless bonded interface. Typical Cu/$SiO_2$ hybrid bonding needs optimized chemical-mechanical polishing (CMP) to make $SiO_2$ surfaces ultra-smooth and hydrophilic, and also combined surface activated process (such as plasma treatment) in ultra-high vacuum to enhance the bonding strength between bonded interfaces. Recently, novel two-step Cu/$SiO_2$ hybrid bonding is proposed. In the first step, plasma activation is applied onto the ultra-smooth surfaces of $SiO_2$ dielectric layer and the $SiO_2$ dielectric layers are bonded spontaneously at room temperature. The bonding strength at room temperature is sufficient to hold the two bonding pads ($SiO_2$—$SiO_2$) together firmly. It is hydrophilic bonding and not necessary to apply extra pressure for the second step, which is a batch anneal process (250-400° C.). The direct Cu—Cu self-diffusion connection is generated during the high temperature annealing. Since $SiO_2$—$SiO_2$ (oxide) bonding takes place at room temperature, Cu oxidation contamination during oxide bonding is not critical. The bonded oxide layer surrounding the copper electrodes encapsulates the Cu—Cu joints from the annealing oven atmosphere; therefore, weakening Cu oxidation during the batch annealing. The bonded oxide ($SiO_2$—$SiO_2$) surface also hermetically seals the copper electrodes during device operation.

The preparation process prior to $SiO_2$—$SiO_2$ (oxide) bonding is shown as below. The ultra-smooth (roughness is nano-meter scale) oxide ($SiO_2$) surface needs multiple chemical-mechanical polishing (CMP) steps with superior Cu recess control (such as shallow and uniform recess versus different pad size) to cope with the requirement of the bonding interface flatness and Cu recess for $SiO_2$—$SiO_2$ (oxide) bonding. The both bonding pads only require a simple clean process by rinsing in de-ionized (DI) water and a plasma surface treatment. Sometimes, a Cu-dishing (recess) is intentionally made on the copper electrodes to optimize the $SiO_2$—$SiO_2$ (oxide) bonding. In batch annealing step, Cu—Cu direct bonding depends on Cu intrinsic expansion and simultaneous Cu—Cu self-diffusion connection during high temperature annealing. Cu expansion is due to differential CTE between Cu and surrounding oxide ($SiO_2$) to bridge the gap between Cu electrodes. Therefore, having shallow and uniform Cu recess (depth) for all Cu pads with different pad size is very important part for high assembly yield.

There are some methods that seeking the solution to reduce the gap between copper electrodes and also lower batch anneal temperature by turning the copper electrodes into Cu-alloy electrodes or filling Cu-alloy layers into recess between copper electrodes. Such as "hybrid bond using a copper alloy for yield improvement" disclosed in US20170025381A1 by Taiwan Semiconductor Manufacturing Co., Ltd. and "low temperature bonded structures" in WO2019199445A1 by Invensas Bonding Technologies, Inc.

Cu-alloy's higher coefficient of thermal expansion (CTE) than bulk Cu can much easier to perform Cu—Cu direct self-diffusion and fill the gap between electrodes without higher anneal temperature. But it increases the higher electrical resistant than pure Cu interconnect consequently but also generates the structure delimitations (such as voids and crack) due to intermetallic compound (IMC) brittleness and Kirkendall effect. Moreover, they did not solve the fundamental issues—complicated and high cost Cu recess control process. That's why they developed much more complicated and proprietary chemical-mechanical polishing (CMP) steps to ensure to generate the shallow and uniform Cu recess (depth) for different size copper electrodes, such as "chemical mechanical polishing for hybrid" in WO2019060304A1 by Invensas Bonding Technologies, Inc. Those Chemical-mechanical polishing (CMP) steps are very expensive, complicated and time-consuming processes.

On the other hand, Cu/Adhesive hybrid bonding has better tolerance in the bond surface flatness and non-coplanarities, because of the easier deformation characteristic of the adhesive during the bonding. Furthermore, the mechanism of Cu/Adhesive hybrid bonding is based on thermal-compression bonding, rather than typical $SiO_2$—$SiO_2$ (oxide) direct bonding and Cu/$SiO_2$ hybrid bonding. Mainly, it can be divided into two main categories: 1) Adhesive-first bonding; 2) Cu-first bonding because of the huge variances in physical features between Cu and adhesive, such as modulus, bonding/curing temperature, and bonding strength.

Adhesive-first bonding avoids the difficulty of underfilling narrow gap between the dielectric layers in the typical Cu—Cu direct bonding. Adhesive is bonded and fully cured in the first step under thermal-compression at a lower temperature (less than 250° C.) prior to the second-step Cu—Cu thermal-compression bonding at a higher temperature (350° C. above). The "Adhesive-first" hybrid bonding still has issues such as large thermal stress, higher thermal budget and low throughput. Also, the thermal sliding between two bonding interfaces during the first-step adhesive bonding/curing may cause the low yield due to the great misalignment. Adhesive-first bonding still need planarization processes, such as chemical-mechanical polishing (CMP) and diamond bit cutting (flying-cut) for the wafer preparation.

Although Cu/Adhesive hybrid bonding is very attractive, the hybrid bonding at low temperature such as below 200° C. is still challenging due to mismatch of the bonding temperature between Cu—Cu (350° C. above) and polymer adhesives (250° C. or lower). To overcome this process temperature mismatch issue, Cu-first bonding is necessary to lower the Cu—Cu bonding temperature by using specific surface activation treatment after planarization process. A pre-bonding surface activation process is employed to remove Cu intrinsic oxide spontaneously formed on the Cu surfaces. After the Cu surface activation, low temperature Cu—Cu bonding could be achieved at below 200° C. shortly prior to the adhesive batch curing without compression. The surface of copper electrodes and adhesive also need to be planarized by diamond bit cutting (flying-cut).

By using chamber in-situ surface activation methods, it can avoid the major problem of Cu re-oxidation. Moreover, chamber in-situ hydrogen (H)-containing formic acid (HCOOH) vapor surface activation method can treat both copper electrodes and adhesive polymer simultaneously at 200° C. for the pre-bonding treatment. Therefore, special thin adhesive is needed for low temperature Cu-first Cu/adhesive hybrid bonding under 200° C. No protrusion of adhesive around the chip corner will affect the close placement of neighboring chips. No thermal sliding during and after thermal compression process will affect alignment of copper electrodes. A spin coating thin adhesive with no voids and high electrical reliability can be cured at 200° C. or even high temperature baking.

Nanoporous metal gains lots attention due to its special intrinsic physical characteristics such as light weight, high surface area metallic structures, good electrical conductivity and the ease of production through various dealloying processes. Nanoporous metal has wide applications including catalysis, sensors, actuators, fuel cells, and microfluidic flow controllers. Moreover, nanoporous copper (NPC) is the novel material for interconnections for advanced IC packaging and die-attachment in power device assembly (see Ref. 1). The typical nanoporous metal structure of nanoporous copper (NPC) provides high surface-area-to-volume ratio, including high-curvature ligaments, and a metallic surface with a large amount of porosity in nanoscale. Its low modulus and low temperature densification (sintering) with less pressure can be the alternative candidate as the capping material of copper pillar in ultra-fine pitch interconnection to substitute typical SAC305 solder cap of copper pillar. The typical dealloying processes, such as electrochemical dealloying, employs a chemical etchant, sometimes in conjunction with an electric potential bias, to selectively remove the sacrificial (active) metal element from precursor alloy system. But it is limited to systems with a sufficiently large gap in electrode potentials between the two alloying elements. Typically, this restricts the application of electrochemical dealloying only to some specific metal-alloy and composition. The extra annealing of precursor alloy prior to dealloying is necessary to avoid cracks after dealloying. Moreover, the residue of the sacrificial metal after electrochemical dealloying is also needed to remove by extra chemical etch and consequently extend the overall process time. Electrochemical dealloying also involves severe environmental and economic issues due to the chemical waste during etch and difficult recovery of dissolved metal components from electrolytes.

Vacuum thermal dealloying (see Ref. 2 and Ref. 3) was developed over one decade. Recently it attracts lots of attentions because many advantages over conventional dealloying processes for its universal, cost-saving and environmentally fabrication of nanoporous metal, and is highly suitable for refractory metals that may be susceptible to oxidation during chemical/electrochemical dealloying. Basically, vacuum thermal dealloying is a vacuum annealing process to selectively evaporate the sacrificial (active) metal element from precursor alloy by using the vapor pressure difference between the two alloying elements.

For example, Cu—Zn alloy system, the vapor pressures of Cu and Zn are calculated by the vapor pressure calculator from Institute of Applied Physics, Vienna University of Technology (see Ref. 4). We are focusing on the low temperature range (below 200° C., 473.15 K) cause the process temperature limitation of current memory device and we can find that clearly the huge vapor pressure difference between Cu and Zn is beyond at least 20 more order magnitude from the related vapor pressure table (see Ref 5). The low melting point and rapid vapor evaporation of Zn is ideal as the sacrificial element of this Cu—Zn alloy system. Meanwhile, the vapor of Zn is a strong reducing medium and it sublimes in the vacuum chamber can block the nanoporous copper getting oxidation. Vacuum thermal dealloying in higher vacuum and lower dealloying temperature promotes Zn volatilization and restricts Cu diffusion. Meanwhile the dealloying at higher vacuum and lower temperature can effectively reduce volume shrinkage and fabricate nanoporous copper with larger porosity, lower modulus and finer pore size than typical electrochemical dealloying.

Moreover, vacuum thermal dealloying can be BEOL compatible process to generate nanoporous copper to improve the electrical resistance of Cu—Cu interconnect of $Cu/SiO_2$ hybrid bonding by filling the sub-micron scale recess of cu-dishing after chemical-mechanical polishing (CMP) steps. It also can simplify the current Cu-first Cu/adhesive hybrid bonding process by using the novel nanoporous copper/adhesive hybrid bonding structure because it eliminates the planarization process (diamond bit flying-cut) and surface activation treatment but also avoid thermal sliding during thermal compression.

REFERENCES

1. "A Review of Nanoporous Metals in Interconnects" Mohan, K., Shahane, N., Liu, R. et al. A Review of Nanoporous Metals in Interconnects. *JOM* 70, 2192-2204 (2018). https://doi.org/10.1007/s11837-018-3081-z
2. "Three-dimensional bicontinuous nanoporous materials by vapor phase dealloying" Lu, Z., Li, C., Han, J. et al. Three-dimensional bicontinuous nanoporous materials by vapor phase dealloying. *Nat Commun* 9, 276 (2018). https://doi.org/10.1038/s41467-017-02167-y
3. "Vacuum thermal dealloying of magnesium-based alloys for fabrication of nanoporous refractory metals" Maria Kosmidou, Michael J. Detisch, Tyler L. Maxwell, and T. John Balk, Department of Chemical and Materials Engineering, University of Kentucky, Lexington, Ky. 40506, USA https://www.cambridge.org/core/journals/mrs-communications/article/vacuum-thermal-dealloying-of-magnesiumbased-alloys-for-fabrication-of-nanoporous-refractory-metals/37BB747F6DDA09127705C122BA8B2560
4. http://wwwjap.tuwien.ac.at/www/surface/vapor_pressure
5.

| Table of vapor pressures of Zn and Cu: | | | |
| --- | --- | --- | --- |
| T(K) | T(° C.) | Zn PRESSURE (PA) | Cu PRESSURE (PA) |
| 373.1 | 100 | 8.89e−8 | 4.83e−36 |
| 383.1 | 110 | 2.65e−7 | 8.26e−35 |
| 393.1 | 120 | 7.46e−7 | 1.22e−33 |
| 403.1 | 130 | 2.00e−6 | 1.58e−32 |
| 413.1 | 140 | 5.09e−6 | 1.81e−31 |
| 423.1 | 150 | 1.24e−5 | 1.84e−30 |
| 433.1 | 160 | 2.91e−5 | 1.68e−29 |
| 443.1 | 170 | 6.56e−5 | 1.39e−28 |
| 453.1 | 180 | 1.43e−4 | 1.05e−27 |
| 463.1 | 190 | 3.00e−4 | 7.21e−27 |
| 473.1 | 200 | 6.12e−4 | 4.58e−26 |
| 483.1 | 210 | 1.21e−3 | 2.67e−25 |
| 493.1 | 220 | 2.33e−3 | 1.46e−24 |
| 503.1 | 230 | 4.37e−3 | 7.49e−24 |
| 513.1 | 240 | 8.00e−03 | 3.60e−23 |
| 523.1 | 250 | 0.0143 | 1.63e−22 |

SUMMARY

An object of the present disclosure is to provide a novel hybrid bonding structure and method that is capable of avoiding the high cost, improving the electrical performance, increasing the throughput and simplifying the process of current low temperature direct hybrid bonding processes. A novel hybrid bonding structure and method that is capable of matching the current Chip-on-Chip (CoC), Chip-On-Wafer (CoW), and Wafer-On-Wafer (WoW) manufacturing platform with better fabrication yield.

A novel hybrid bonding structure and method is taking the advantage of low modulus and high surface area of nanoporous copper to achieve the lower bonding temperature, better electrical resistance, higher non-coplanarity tolerance in hybrid bonding process for high performance computing application.

Nanoporous copper that be synthesized in vacuum thermal dealloying method is the suitable material to fill the sub-micron scale recess of Cu-dishing after chemical-mechanical polishing (CMP) in $Cu/SiO_2$ hybrid bonding because of the better electrical resistance of bulk-like copper after densification during nanoporous copper (sintering) bonding. Vacuum thermal dealloying can meet with exist BEOL semiconductor manufacturing process.

Moreover, the hybrid bonding structure formed by low modulus nanoporous copper pillar and partial cured adhesive cavity can ensure the precise placement and also avoid thermal sliding during thermal compression process. The hybrid bonding structure and method also simplifies the process of Cu-first Cu/Adhesive hybrid bonding by eliminating the planarization process (diamond bit flying-cut) and surface activation treatment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE PREFERRED EMBODIMENT

Figure 1:
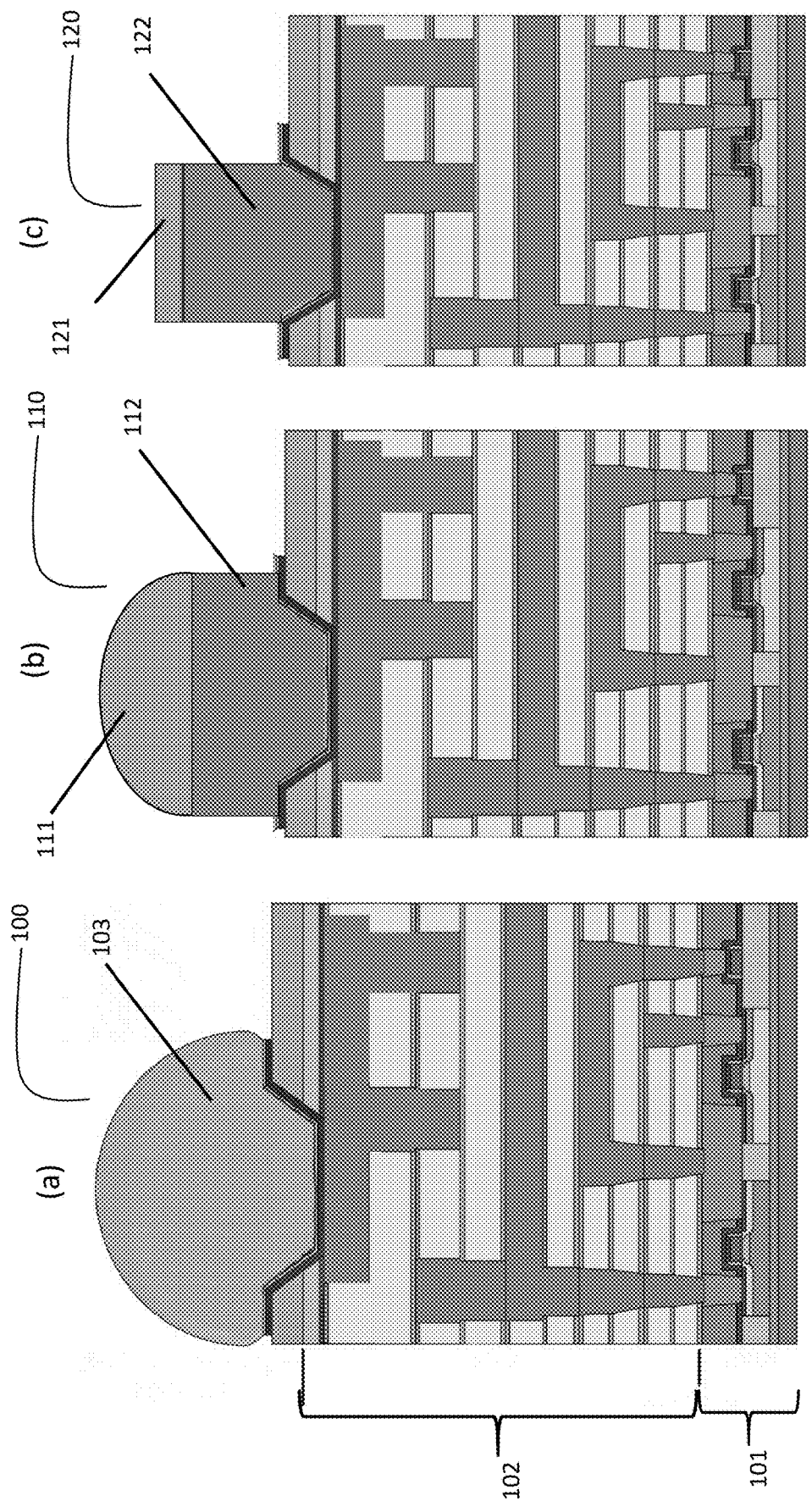
FIG. 1 is cross-sectional views illustrating the evolution of interconnections technology in high performance computing application.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatial relative terms, such as "beneath," "below," "lower," "above," "upper" and the like, may be used herein for ease of description to describe one element or feature's relationship to another element(s) or feature(s) as illustrated in the figures. The spatial relative terms are intended to encompass different orientations of the device in use or operation in addition to the orientation depicted in the figures. The apparatus may be otherwise oriented (rotated 90 degrees or at other orientations) and the spatial relative descriptors used herein may likewise be interpreted accordingly.

FIG. 1 illustrates the evolution of interconnections technology in high performance computing application. cross-sectional view 100 (FIG. 1-*a*) is the introduction of BEOL (back end of line) from Wikipedia (https://en.wikipedia.org/wiki/Back_end_of_line). Typically, a semiconductor die/chip is connected with PCB substrate through FEOL 101 and BEOL 102 stacks by C4 solder ball 103 (conventional reflow). The pitch between C4 solder balls 103 is about 130 μm more (>130 μm). In cross-section view 110 (FIG. 1-*b*), it illustrates a semiconductor die/chip is connected with substrate through FEOL and BEOL stacks by copper pillar 112 and C2 solder ball 111 (reflow). The pitch between copper pillars 112 is between 60 μm and 130 μm. In cross-section view 120 (FIG. 1-*c*), it shows a semiconductor die/chip is connected with silicon substrate through FEOL and BEOL stacks by micro copper pillar 122 and SAC solder cap 121 (TCB or local reflow). The pitch between micro copper pillars 122 is less than 40 μm (<40 μm).

Figure 2:
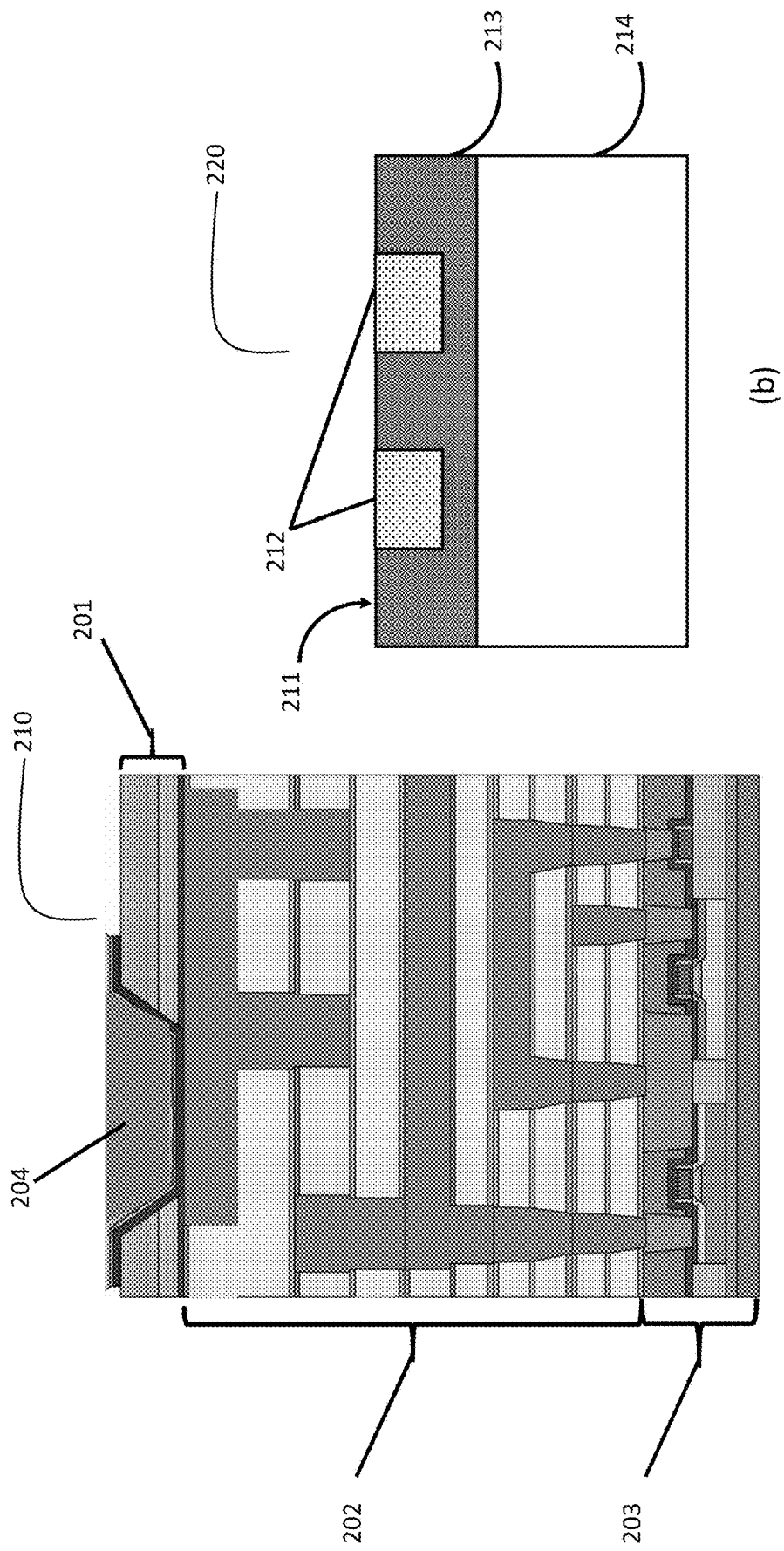
FIG. 2 is a schematic diagram illustrating the pad structures of typical direct hybrid bonding and its simplified drawing.

FIG. 2 illustrates the bond pad structure of typical direct hybrid bonding and its simplified drawing. In cross-section view 210, bonding layer 201 is located on the top of FEOL 203 and BEOL 202 stacks. The pitch between bond pads 204 is within several μm (such as 3-5 μm). A semiconductor die 220 includes a base substrate 214 and an insulating dielectric layer 213. The insulating dielectric layer 213 is deposited or formed over the base substrate 214. A bonding surface 211 of the die 220 can include conductive features 212, such as interconnect structures for example, embedded into the insulating layer 213 and arranged so that the conductive features 212 from respective bonding surfaces 211 can be mated and joined during bonding, if desired. The joined interconnect features 212 can form continuous conductive interconnects (for signals, power, etc.) between stacked dies 220.

Damascene process (or the like) may be used to form the embedded conductive features 212 in the insulating layer 213. The conductive features 212 may be composed of metals (e.g., copper, etc.) or other conductive materials, or combinations of materials, and include structures, traces, pads, patterns and so forth. The conductive features 212 may be included in the insulating layer 213 to provide an electrical and/or thermal path or may instead be configured to balance out the metallization of the bonding surface 211, through the use of additional pads or so-called dummy pads, traces, patterns or the like. After the conductive features 212 are formed, the exposed surface of the die 220, including the insulating layer 213 and the conductive features 212 can be planarized to form a flat bonding surface 211 where recess (not shown) may occur on the top of the conductive features 212.

Figure 3:
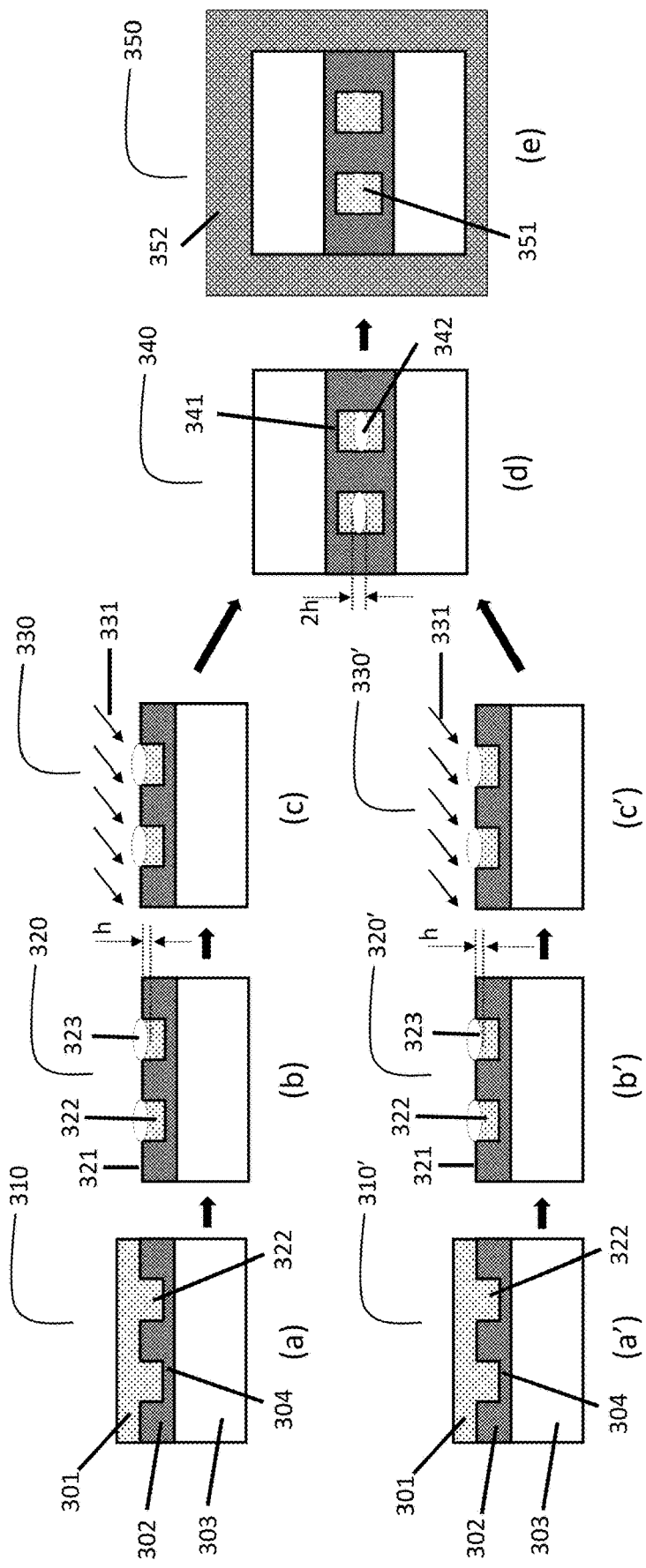
FIG. 3 is a schematic diagram illustrating the typical $Cu/SiO_2$ hybrid bonding process.

FIG. 3 illustrates the brief fabrication process flow of a typical Cu/SiO$_2$ direct hybrid bonding. In STEP 310 and STEP 310', a semiconductor die includes a base substrate 303 and an insulating or dielectric layer 302. An etch process is performed into the insulating or dielectric layer 302 to form openings 304 thereon. A diffusion barrier layer (not shown) is formed to line the openings 304 and then a copper seed layer (not shown) is formed to line the openings 304 over the diffusion barrier layer. A copper (Cu) fill layer 301 is formed to fill the openings 304 over the copper seed layer so as to form a plurality of copper electrodes 322 on the base substrate 303. In STEP 320 and STEP 320', the copper fill layer 301 is planarized by chemical-mechanical polishing (CMP) process and a super-flat bonding interface 321 that embedded with the copper electrodes 322 is formed accordingly. The copper electrodes 322 respectively have a Cu-dishing 323 with a recess height of h, wherein h is the distance from the top level of bonding interface 321 to the bottom of Cu-dishing 323. In STEP 330 and STEP 330', a plasma treatment 331 is applied onto the bonding interface 321. In STEP 340, the semiconductor die shown in FIG. 3(*c*) and the semiconductor die shown in FIG. 3(*c'*) are positioned face to face with fine alignment and a SiO$_2$—SiO$_2$ dielectric bonding is performed at room temperature. An embedded interconnect 341 is then formed between the base substrates 303. The embedded interconnect 341 has a void 342 formed therein which has a height of 2h. In STEP 350, a high temperature (300-400° C.) annealing 352 is performed onto the pair of semiconductor dies. The copper electrodes expand and the gaps diminish due to heat. At the end, the copper electrodes perform self-diffusion into the embedded interconnect 351 without any gap formed therein.

Figure 4:
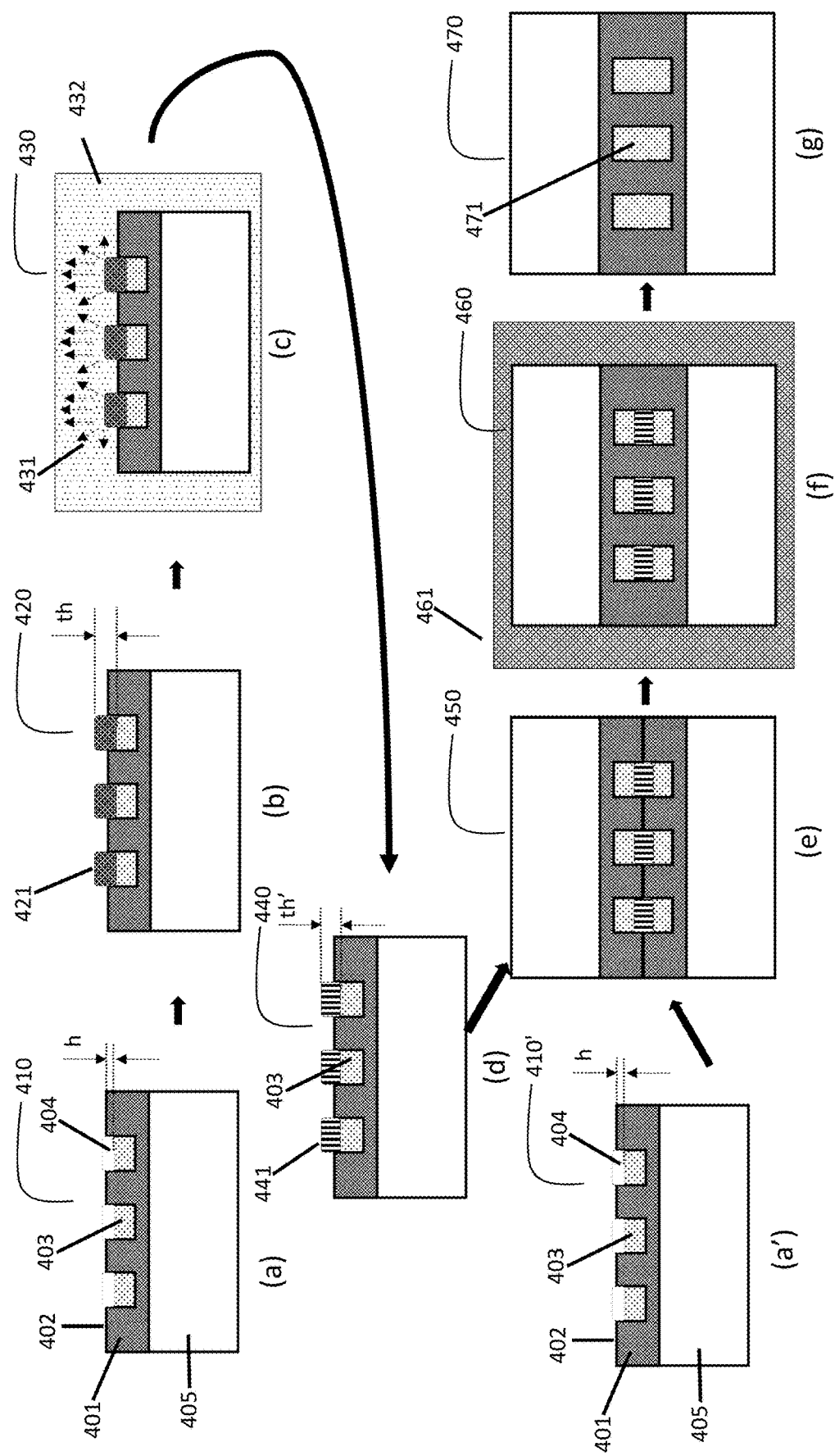
FIG. 4 is a schematic diagram illustrating the novel $Cu/SiO_2$ hybrid bonding process by using nanoporous copper to filling the gap/crack between the copper features according to the present disclosure.

FIG. 4 illustrates the Cu/SiO$_2$ hybrid bonding process by using nanoporous copper to fill the gap/crack between the copper features according to the present disclosure. In STEP 410 shown in FIG. 4(*a*), a first semiconductor structure includes a base substrate 405 and an insulating or dielectric layer 401 formed on the base substrate 405. An etch may be performed into the insulating or dielectric layer 401 to form a plurality of openings thereon. A diffusion barrier layer (not shown) is formed to line the openings and then a copper seed layer (not shown) is formed to line the openings over the diffusion barrier layer. A copper fill layer is formed to fill the openings over the copper seed layer. The copper fill layer is planarized by chemical-mechanical polishing (CMP) process and a super-flat bonding interface 402 and copper features 403 embedded in the openings are formed accordingly. There exists a plurality of recesses 404 present above the copper features 403 respectively on the first semiconductor structure. The recess 404 has a depth of h from the top level of the bonding interface 402 to its bottom. Therefore, the tops of the copper features 403 are lower than the top level of the bonding interface 402.

In STEP 410' shown in FIG. 4(*a'*), a second semiconductor structure includes a base substrate 405 and an insulating or dielectric layer 401 formed on the base substrate 405. An etch may be performed into the insulating or dielectric layer 401 to form a plurality of openings thereon. A diffusion barrier layer (not shown) is formed to line the openings and then a copper seed layer (not shown) is formed to line the openings over the diffusion barrier layer. A copper fill layer is formed to fill the openings over the copper seed layer. The copper fill layer is planarized by chemical-mechanical polishing (CMP) process and a super-flat bonding interface 402 and copper features 403 embedded in the openings are formed accordingly. There exists a plurality of recesses 404 present above the copper features 403 respectively on the second semiconductor structure. The recess 404 has a depth of h from the top level of the bonding interface 402 to its bottom. Therefore, the tops of the copper features 403 are lower than the top level of the bonding interface 402.

In STEP 420 shown in FIG. 4(b), precursor alloys ($Cu_xZn_{1-x}$) 421 are respectively formed over the copper features 403 by depositing, filling, co-sputtering, or ALD (atomic layer deposition) active metals having zinc and noble metals having copper. The precursor alloy 421 has a thickness of th which is much larger than 2h. In STEP 430 shown in FIG. 4(c), the first semiconductor structure having the precursor alloys 421 is disposed in a high vacuum chamber 432 and subjected to a vacuum thermal dealloying 431 to sublimate and therefore remove the active metals out of the precursor alloys 421. The remnants of the precursor alloys 421 consequentially self-organize into bi-continuous open porous (nanoporous) copper structures with tens nanometer scale ligaments. In STEP 440 shown in FIG. 4(d), porous copper fill layers 441 are respectively formed on the copper features 403 accordingly after the precursor alloys 421 are subjected to the vacuum thermal dealloying. The porous copper fill layers 441 protrude above the bonding interface 402 and respectively have a thickness of th' which is less than th because of the dealloying and is also larger than two-times of the height h of the recesses because of low modulus and porosity. In STEP 450 shown in FIG. 4(e), the first semiconductor structure shown in FIG. 4(d) and the second semiconductor structure shown in FIG. 4(a') are positioned face to face with fine alignment and their dielectric layers 401 are bonded together at room temperature. The porous copper fill layers 441 are filled in the recesses 404 on the second semiconductor structure, respectively. In STEP 460 shown in FIG. 4(f), the pair of the first and second semiconductor structures is subjected to a low high temperature (below 250° C.) batch annealing 461. Accordingly, the porous copper fill layers 441 expand and the gaps between the upper and lower copper features 403 diminish. At the end, the porous copper fill layers 441 perform self-diffusion sintering. In STEP 470 shown in FIG. 4(g), the copper features 403 with porous copper fill layers 441 finally turn into bulk-like copper features 471.

Figure 5:
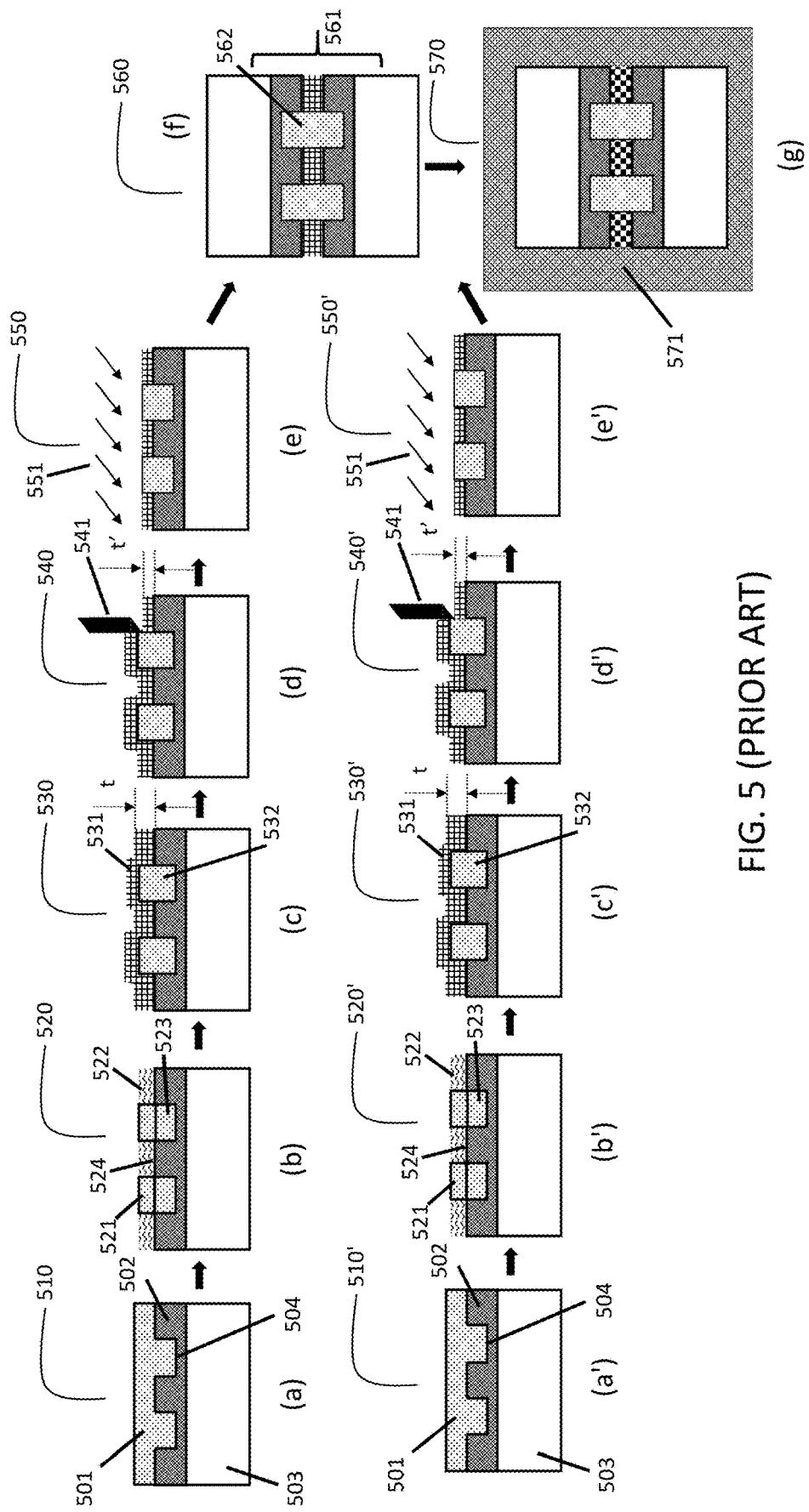
FIG. 5 is a schematic diagram illustrating the typical Cu-first Cu/adhesive hybrid bonding process.

FIG. 5 illustrates the typical Cu-first Cu/adhesive hybrid bonding process. A semiconductor die includes a base substrate 503 and insulating or dielectric layer 502. An etch is performed into insulating or dielectric layer 502 to form openings 504 thereon. A diffusion barrier layer (not shown) is formed to line the openings 504 and then a copper seed layer (not shown) is formed to line the openings 504 over the diffusion barrier layer. In STEP 510 and STEP 510', a copper (Cu) fill layer 501 is formed to fill the openings 504 over the copper seed layer so as to form a plurality of copper electrodes on the base substrate 503. In STEP 520 and 520', the copper fill layer 501 is planarized by chemical-mechanical polishing process and a bonding interface 524 that embedded with the copper electrodes 523 is formed accordingly. The copper electrodes 523 respectively have a Cu-dishing with recess. A photoresist layer 522 is formed over the bonding interface 524. The photoresist layer 522 is etched to selectively form openings to expose the copper electrodes 523. A copper pad layer 521 is then deposit over the copper electrodes 523 by electroless plating. In STEP 530 and STEP 530', the photoresist layer 522 is removed to expose completely the copper pad layer 521. The semiconductor die is then subjected to a anneal process so as to form solid copper electrodes 532 by the self-diffusion between the copper pad layer 521 and the copper electrodes 523. An adhesive layer 531 with a thickness of t is applied over the copper electrodes 532 and the bonding interface 524. In STEP 540 and 540', the copper electrodes 532 and the adhesive layer 531 is planarized by a diamond bit (flying-cut) 541 to have the surfaces of the copper electrodes 532 and adhesive layer 531 flat. The cut surface has a thickness of t'. In STEP 550 and 550', a pre-bonding surface activation 551 is performed on the surface of copper electrodes 532 and adhesive layer 531 by H-containing HCOOH formic acid vapor. In STEP 560, the semiconductor die shown in FIG. 5(e) and the semiconductor die shown in FIG. 5(e') are positioned face to face and subjected to a thermal compression bonding 561 under 200° C. so as to form a copper-copper direct bonding 562. In STEP 570, the pair of the semiconductor dies is subjected to a post-bonding batch curing 571 without compression to fully cure the adhesive layers 531.

Figure 6:
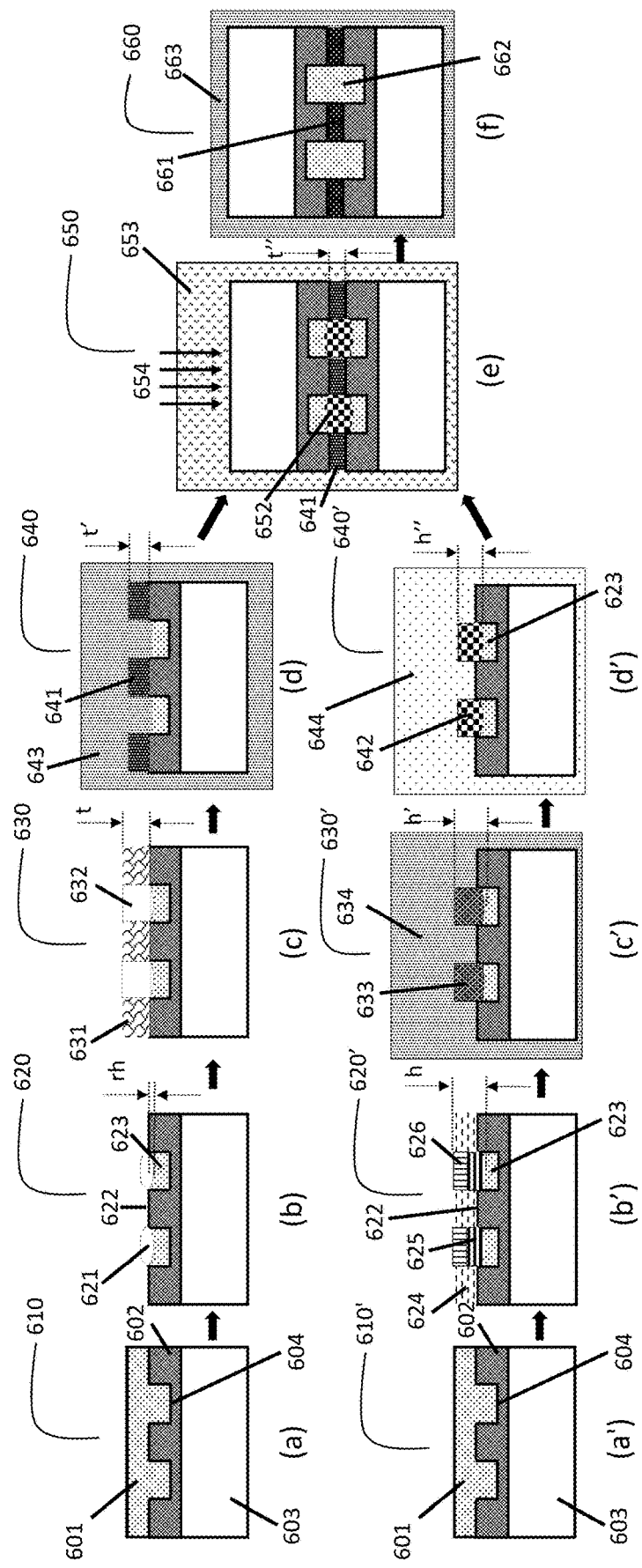
FIG. 6 is a schematic diagram illustrating the novel Cu/Adhesive hybrid bonding process by using nanoporous copper pillar according to the present disclosure.

FIG. 6 illustrates the Cu/Adhesive hybrid bonding process by using nanoporous copper pillar according to the present disclosure. In STEP 610 shown in FIG. 6(a), a first semiconductor structure includes a base substrate 603 and an insulating or dielectric layer 602 formed on the base substrate 603. An etch may be performed into the insulating or dielectric layer 602 to form a plurality of openings 604 thereon. A diffusion barrier layer (not shown) is formed to line the openings 604 and then a copper seed layer (not shown) is formed to line the openings 604 over the diffusion barrier layer. A copper (Cu) fill layer 601 is formed to fill the openings 604 over the copper seed layer so as to form a plurality of copper features on the insulating or dielectric layer 602. In STEP 620 shown in FIG. 6(b), the copper fill layer 601 is planarized by chemical-mechanical polishing (CMP) process and an ultra-flat bonding interface 622 and copper features 623 embedded in the openings 604 are formed accordingly. There exists a plurality of recesses 621 present above the copper features 623 respectively on the first semiconductor structure. The recess 621 has a depth of rh from the top level of the bonding interface 622 to its bottom. Therefore, the tops of the copper features 623 are lower than the top level of the bonding interface 622. In STEP 630 shown in FIG. 6(c), an adhesive layer 631 with a thickness of t is applied over the bonding interface 622 and the copper features 623. An etch is performed into the adhesive layer 631 to form a plurality of openings 632 to expose the copper features 623, respectively. In STEP 640 shown in FIG. 6(d), the adhesive layer 631 is subjected to a pre-baking 643 at low temperature (below 200° C.) to turn into a partial cured adhesive 641 with a thickness of t' due to evaporation of the solvent and shrinkage by curing.

In STEP 610' shown in FIG. 6(a'), a second semiconductor structure includes a base substrate 603 and an insulating or dielectric layer 602 formed on the base substrate 603. An etch may be performed into the insulating or dielectric layer 602 to form a plurality of openings 604 thereon. A diffusion barrier layer (not shown) is formed to line the openings 604 and then a copper seed layer (not shown) is formed to line the openings 604 over the diffusion barrier layer. A copper (Cu) fill layer 601 is formed to fill the openings 604 over the copper seed layer so as to form a plurality of copper features on the insulating or dielectric layer 602. In STEP 620' shown in FIG. 6(b'), the copper fill layer 601 is planarized by chemical-mechanical polishing (CMP) process and a bonding interface 622 and copper features 623 embedded in the openings 604 are formed accordingly. There exists a plurality of recesses present above the copper features 623 respectively on the second semiconductor structure. A photoresist layer 624 acted as a mask is formed on the bonding interface 622 and fills the recesses. An etch is performed into the photoresist layer 624 to form a plurality of opening to expose the copper features 623, respectively. A first metal layer 625 and a second metal layer 626 are deposited sequentially by fine precise control of electroless plating to fill the openings of the photoresist layer 624. Therefore, the first metal layer 625 is formed on the top of the copper features 623 and the second metal layer 626 is then formed on the first metal layer 625. In one embodiment, the first metal layer 625 may be a noble metal and composed of pure copper and the second metal layer 626 may be an active metal and composed of zinc (Zn). The second metal layer 626 generally has a weight less than that of the first metal layer 625. Therefore, the metal constituting the first metal layer 625 is the primary metal and the metal constituting the second metal layer 626 is the secondary metal. The multilayer metal stacks, each including the first metal layer 625 and the second metal layer 626 are formed accordingly and have a height of h, wherein h=rh+the thickness of the photoresist layer 624.

In STEP 630' shown in FIG. 6(c'), the photoresist layer 624 is removed to expose the multilayer metal stacks on the copper features 623. Afterward, an anneal 634 is performed to convert the multilayer metal stacks into copper alloys 633 respectively when the first metal layer 625 is composed of pure copper. Therefore, the copper alloy 633 is composed of copper and an active metal as the secondary metal. The copper alloy 633 has a height of h'. In STEP 640' shown in FIG. 6(d'), the second semiconductor structure having the copper alloys 633 is disposed in a high vacuum chamber 644 and subjected to a vacuum thermal dealloying to sublimate and therefore remove the active metals out of copper alloys 633. The remnants of the copper alloys 633 consequentially self-organize into bi-continuous open porous (nanoporous) copper pillars 642 with tens nanometer scale ligaments. The porous copper pillars 642 are respectively formed on the copper features 623 and protrude above the bonding interface 622. The porous copper pillars 642 shrink from the copper alloys 633 after experiencing the vacuum thermal dealloying and have a height of h" smaller than h'. Therefore, the shrinkage rate of dealloying of the copper alloys 633 is equal to (h'−h")/h'.

In STEP 650 shown in FIG. 6(e), the first semiconductor structure shown in FIG. 6(d) and the second semiconductor structure shown in FIG. 6(d') are immersed into acetic acid to perform copper-oxide reduction pretreatment 653. The first and second semiconductor structures are positioned face to face with the porous copper pillars 642 being filled in the openings 632 respectively and pressed to bond their dielectric layers 601 together with the partial cured adhesive 641 by performing a low temperature thermal compression bonding at a temperature below 200° C. in an environment which contains formic acid vapor with less bonding pressure 654 (such as 8-10 MPa) within a short time (no more than 10 min). The porous copper pillars 642 are therefore pressed and shrunk into a bulk-like copper feature 652 with a relatively high density (about 85-95%). The gap between the first and second semiconductor structures is t" which is smaller than t'. In STEP 660 shown in FIG. 6(f), the pair of the first and second semiconductor structures is subjected to a long-time post-bonding batch curing 663 without compression at a temperature of 200° C. to fully cure the partial cured adhesive 641. At the end, the bulk-like copper features 652 bond with the copper features 632 of the first and second semiconductor structures to form bulk-like copper features 662 accordingly since the fully cured adhesive layer 661 firmly bonds the first and second semiconductor structures together and copper expands at a temperature of 200° C.

Although the preferred embodiments of the disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. A method of bonding a pair of semiconductor structures together, the method comprising:
   providing a pair of semiconductor structures comprising corresponding dielectric layers and corresponding copper features arranged in the dielectric layers, wherein the pair of semiconductor structures comprises a first semiconductor structure and a second semiconductor structure;
   arranging a precursor alloy on the copper feature of the first semiconductor structure, wherein the precursor alloy comprising copper and an active metal;
   performing a vacuum thermal dealloying on the precursor alloy to remove the active metal from the precursor alloy so that the remnants of the precursor alloy self-organize into a porous copper fill layer;
   arranging the porous copper fill layer between the two copper features and bonding the two dielectric layers of the two semiconductor structures together; and
   performing an anneal to the two semiconductor structures to turn the two copper features and the porous copper fill layer into a bulk-like copper feature.

2. The method as claimed in claim 1, wherein the anneal is performing at a temperature below 250° C.

3. The method as claimed in claim 1, wherein the active metal is zinc.

4. The method as claimed in claim 1, wherein the two dielectric layers of the two semiconductor structures are flat and are bonded together at room temperature.

5. The method as claimed in claim 1, wherein the providing the second semiconductor structure comprises:
   performing an etch into the dielectric layer of the second semiconductor structure to form an opening for the copper feature of the second semiconductor structure;
   forming a diffusion barrier layer lining the opening;
   forming a copper seed layer lining the opening over the diffusion barrier layer;
   forming a copper fill layer filling the opening over the copper seed layer; and
   performing a chemical mechanical polish (CMP) to planarize the copper fill layer and to form the copper feature of the second semiconductor structure.

6. The method as claimed in claim 5, wherein a recess is formed above the copper feature of the second semiconductor structure, and wherein the porous copper fill layer is filled in the recess.

7. A method of bonding a pair of semiconductor structures together, the method comprising:
   providing a pair of semiconductor structures comprising corresponding dielectric layers and corresponding copper features arranged in the dielectric layers, wherein the pair of semiconductor structures comprises a first semiconductor structure and a second semiconductor structure;
   forming an adhesive layer on the dielectric layer of the first semiconductor structure, wherein the adhesive layer has an opening for the copper feature of the first semiconductor structure;

curing the adhesive layer into a partial cured adhesive;

arranging a copper alloy on the copper feature of the second semiconductor structure, wherein the copper alloy comprising copper and an active metal;

performing a vacuum thermal dealloying on the copper alloy to remove the active metal from the copper alloy so that the remnants of the copper alloy self-organize into a porous copper pillar;

arranging the porous copper pillar between the two copper features and performing a thermal compression bonding on the two semiconductor structures to bond the two dielectric layers together with the partial cured adhesive and to turn the two copper features and the porous copper pillar into a bulk-like copper feature; and fully curing the partial cured adhesive.

8. The method as claimed in claim 7, further comprising:

before the performing the thermal compression bonding, immersing the two semiconductor structures into acetic acid to perform copper-oxide reduction pretreatment.

9. The method as claimed in claim 8, wherein the thermal compression bonding is performing at a temperature below 200° C.

10. The method as claimed in claim 9, wherein the thermal compression bonding is performing in an environment containing formic acid vapor.

11. The method as claimed in claim 7, wherein the fully curing the partial cured adhesive is performed without compression at a temperature of 200° C.

12. The method as claimed in claim 7, wherein the active metal is zinc.

13. The method as claimed in claim 7, wherein the arranging the copper alloy comprises:

depositing a first metal layer and a second metal layer on the copper feature of the second semiconductor structure, wherein the first metal layer comprises pure copper and the second metal layer comprises the active metal; and performing an anneal to the second semiconductor structure to convert the first and second metal layers into the copper alloy.

14. The method as claimed in claim 7, wherein the providing the first semiconductor structure comprises:

performing an etch into the dielectric layer of the first semiconductor structure to form an opening for the copper feature of the first semiconductor structure;

forming a diffusion barrier layer lining the opening;

forming a copper seed layer lining the opening over the diffusion barrier layer;

forming a copper fill layer filling the opening over the copper seed layer; and performing a chemical mechanical polish (CMP) to planarize the copper fill layer and to form the copper feature of the first semiconductor structure.

15. The method as claimed in claim 14, wherein a recess is formed above the copper feature of the first semiconductor structure, and wherein the porous copper pillar is filled in the recess.

* * * * *